(12) United States Patent
Shabgard et al.

(10) Patent No.: US 12,119,146 B2
(45) Date of Patent: Oct. 15, 2024

(54) COAXIAL PHASE CHANGE MATERIAL HEAT SINK FOR ELECTRIC CHARGING CABLE

(71) Applicants: The Board of Regents of the University of Oklahoma, Norman, OK (US); The Board of Trustees of The Leland Stanford Junior University, Stanford, CA (US); The University of Connecticut, Farmington, CT (US)

(72) Inventors: Hamidreza Shabgard, Norman, OK (US); Amir Faghri, Los Angeles, CA (US); Kenneth Goodson, Portola Valley, CA (US); Mehdi Asheghi, Palo Alto, CA (US)

(73) Assignees: The Board of Regents of the University of Oklahoma, Norman, OK (US); The University of Connecticut, Farmington, CT (US); The Board of the Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/897,401

(22) Filed: Jun. 10, 2020

(65) Prior Publication Data

US 2020/0395147 A1 Dec. 17, 2020

Related U.S. Application Data

(60) Provisional application No. 62/860,060, filed on Jun. 11, 2019.

(51) Int. Cl.
*F28D 15/00* (2006.01)
*B60L 53/18* (2019.01)
(Continued)

(52) U.S. Cl.
CPC .............. *H01B 7/425* (2013.01); *B60L 53/18* (2019.02); *B60L 53/302* (2019.02); *F28D 15/04* (2013.01); *F28D 2021/0029* (2013.01)

(58) Field of Classification Search
CPC ................ F28D 15/0275; F28D 15/04; F28D 2021/0029; F28D 20/023;
(Continued)

(56) References Cited

U.S. PATENT DOCUMENTS 4,972,759 A * 11/1990 Nelson .................... F24H 1/182
122/19.2
4,976,308 A * 12/1990 Faghri ................... F28D 20/023
165/10
(Continued)

FOREIGN PATENT DOCUMENTS

DE 102016112261 1/2018
WO WO 2017/133893 8/2017
(Continued)

OTHER PUBLICATIONS

Qinlong Ren et al., A comparative study of PCM melting process in a heat pipe-assisted LHTES unit enhanced with nanoparticles and metal foams by immersed boundary-lattice Boltzmann method at pore-scale, Mar. 7, 2018, International Journal of Heat and Mass Transfer 121 p. 1214-1228 (Year: 2018).*
(Continued)

*Primary Examiner* — Travis Ruby
(74) *Attorney, Agent, or Firm* — DUNLAP CODDING, P.C.

(57) ABSTRACT

A heat sink apparatus having a pair of casings hinged in a clamshell arrangement and configured to contain a portion of an electric charging cable, the casings each having an
(Continued)

inner space which contains a phase change material for absorbing heat generated during current flow through the electric charging cable.

5 Claims, 6 Drawing Sheets

(51) Int. Cl.
  *B60L 53/302* (2019.01)
  *F28D 15/04* (2006.01)
  *H01B 7/42* (2006.01)
  *F28D 21/00* (2006.01)

(58) Field of Classification Search
  CPC .......... F28D 2020/0013; B60L 53/302; B60L 53/18; H01B 7/421; H01B 7/42; H01B 7/425; F28F 9/002; F28F 20/023; F28F 1/20; F28F 1/30; B65D 5/6694; B65D 35/247; F16L 59/023
  See application file for complete search history.

(56) References Cited

U.S. PATENT DOCUMENTS

| | | | |
|---|---|---|---|
| 5,269,369 A | 12/1993 | Faghri | |
| 5,770,295 A | 6/1998 | Alderman | |
| 5,909,099 A | 6/1999 | Watanabe et al. | |
| 7,505,269 B1 | 3/2009 | Cosley et al. | |
| 9,287,646 B2 | 3/2016 | Mark | |
| 9,321,362 B2 | 4/2016 | Woo et al. | |
| 9,527,403 B2 | 12/2016 | Mardall et al. | |
| 9,701,210 B2 | 7/2017 | Woo | |
| 9,761,976 B2 | 9/2017 | Mark | |
| 10,202,046 B2 | 2/2019 | Kohler | |
| 11,065,970 B2 | 7/2021 | Moriya | |
| 2011/0284189 A1 | 11/2011 | Sinha et al. | |
| 2012/0085518 A1* | 4/2012 | Ichkahn | H01S 3/042 165/104.26 |
| 2012/0193929 A1* | 8/2012 | Karner | B60L 53/305 294/174 |
| 2014/0284020 A1 | 9/2014 | Amir et al. | |
| 2015/0217654 A1 | 8/2015 | Woo et al. | |
| 2016/0200206 A1 | 7/2016 | Woo et al. | |
| 2016/0270257 A1 | 9/2016 | Mark | |
| 2017/0074598 A1* | 3/2017 | Winkler | F28D 15/06 |
| 2017/0144558 A1* | 5/2017 | Remisch | H01B 9/02 |
| 2018/0277283 A1 | 9/2018 | Remisch et al. | |
| 2019/0322185 A1 | 10/2019 | Kinomura | |
| 2022/0212554 A1 | 7/2022 | Gontarz | |

FOREIGN PATENT DOCUMENTS

| | | |
|---|---|---|
| WO | WO 2017/162495 | 9/2017 |
| WO | WO 2018/155895 | 8/2018 |

OTHER PUBLICATIONS

David Reay, Thermal energy storage: the role of the heat pipe in performance enhancement, 2015, Oxford University Press, International Journal of Low-Carbon Technologies 10, p. 99-109 (Year: 2015).*

Allen et al., "Robust Heat Transfer Enhancement During Melting and Solidification of a Phase Change Material Using a Combined Heat Pipe-Metal Foam or Foil Configuration", Journal of Heat Transfer, vol. 137, Oct. 2015.

"High Power Charging—CCS-based fast charging with up to 500 A", Phoenix Contact—Inspiring Innovations, Phoenix Contact GmbH & Co. KG, 2017.

"SWCC Water-Cooled Cable—Contribution to Optimum Operation of Electric Furnace", SWCC Group—Creating for the Future, SWCC Showa Cable Systems Co., Ltd., retrieved from www.swcc.co.jp/, 2018.

"High Power Cable Cooling", Application Bulletin, Arctic Chill, retrieved from www.arcticchillergroup.com, 2018.

PCT Notification of Transmittal of the International Search Report and Written Opinion regarding PCT App. No. PCT/US20/13145, mailed May 7, 2020.

Jafaripour et al., Experimental investigation for the thermal management of a coaxial electrical cable system using a form-stable low temperature phase change material, ScienceDirect, Journal of Energy Storage, vol. 44, Par B, Dec. 15, 2021, 3 pgs.

* cited by examiner

COAXIAL PHASE CHANGE MATERIAL HEAT SINK FOR ELECTRIC CHARGING CABLE

CROSS-REFERENCE TO RELATED APPLICATIONS

The present patent application incorporates by reference the entire provisional patent application identified by U.S. Ser. No. 62/860,060, filed on Jun. 11, 2019, and claims priority thereto under 35 U.S.C. 119(e).

BACKGROUND

Electric vehicles (EVs) have become a popular alternative to vehicles powered primarily by fossil fuels. An EV is charged by passing a current through a power receiving connector (such as an electrical cable) attached to a vehicle body, when the power receiving connector is coupled with a power supply connector which is, in turn, cable-connected to a charging station. The power receiving connectors are prone to produce excessive heat if not cooled properly. The heat generation is proportional to the electrical resistance of the cables and connectors as well as the electrical current and can limit the electrical current throughput, and thereby the charging capacity of the EVs. There are a number of problems associated with the limited charging capacity of the EVs, including short driving ranges and long charging times. Attempts have been made to improve short driving ranges by applying more powerful and efficient batteries. However, the excessive heating of electrical connectors and cables has remained as an obstacle to achieve reduced charging times.

Other applications such as electrical furnaces and high power transmission lines also face limited current carrying capacity due to thermal issues. Traditionally, the higher currents have been handled with large diameter and heavy cables that increase costs and reduce mobility. Such large and heavy cables are especially problematic for mobile applications such as EVs. Attempts have been made to reduce the cable size and mass by actively cooling cables using methods such as liquid cooling and chillers. However, such active cooling methodologies increase the complexity and operational costs and may not provide sufficient cooling. For example, active cable cooling methods can typically handle power throughputs up to 1 MW at 1.2 kA in an AWG 0000 gauge cable with a copper core diameter of about 12 mm while maintaining the cable temperature below 80° C. Such power throughput results in heat generation rates of about 1 kW (corresponding to heat fluxes of ≈1 W/cm$^2$) for a 3 m long cable, which increases with increasing the cable length. As such, increasing the power throughputs beyond 1 MW, and/or using longer or smaller diameter cables will lead to failure of existing active cooling methods. Quantitatively, replacing a 3 m AWG 0000 gauge cable with an AWG 3 gauge cable (conductor diameter ≈6 mm) will quadruple the electrical resistance and heat generation ≈4 kW), which is beyond the limits of existing active cooling methods.

It is toward alleviating this and other disadvantages that the apparatus of the present disclosure is directed. There is a need for a passive cooling/heat removal-dissipation method that does not require an active liquid cooling, thereby eliminating the risks of leakage and additional power source for circulating a working fluid. There is also a need for a device that can be retrofitted to existing cables without requiring substantial changes to existing systems. There is further a need for a cooling/heat removal device that works independent of ambient temperature. It is towards these solutions that the apparatus of the present disclosure is directed.

BRIEF DESCRIPTION OF THE DRAWINGS

Several embodiments of the present disclosure are hereby illustrated in the appended drawings. It is to be noted however, that the appended drawings only illustrate several typical embodiments and are therefore not intended to be considered limiting of the scope of the present disclosure. Further, in the appended drawings, like or identical reference numerals or letters may be used to identify common or similar elements and not all such elements may be so numbered. The figures are not necessarily to scale and certain features and certain views of the figures may be shown as exaggerated in scale or in schematic in the interest of clarity and conciseness. For example, thicknesses and lengths are not limited to those shown in the drawings.

DETAILED DESCRIPTION

Figure 1:
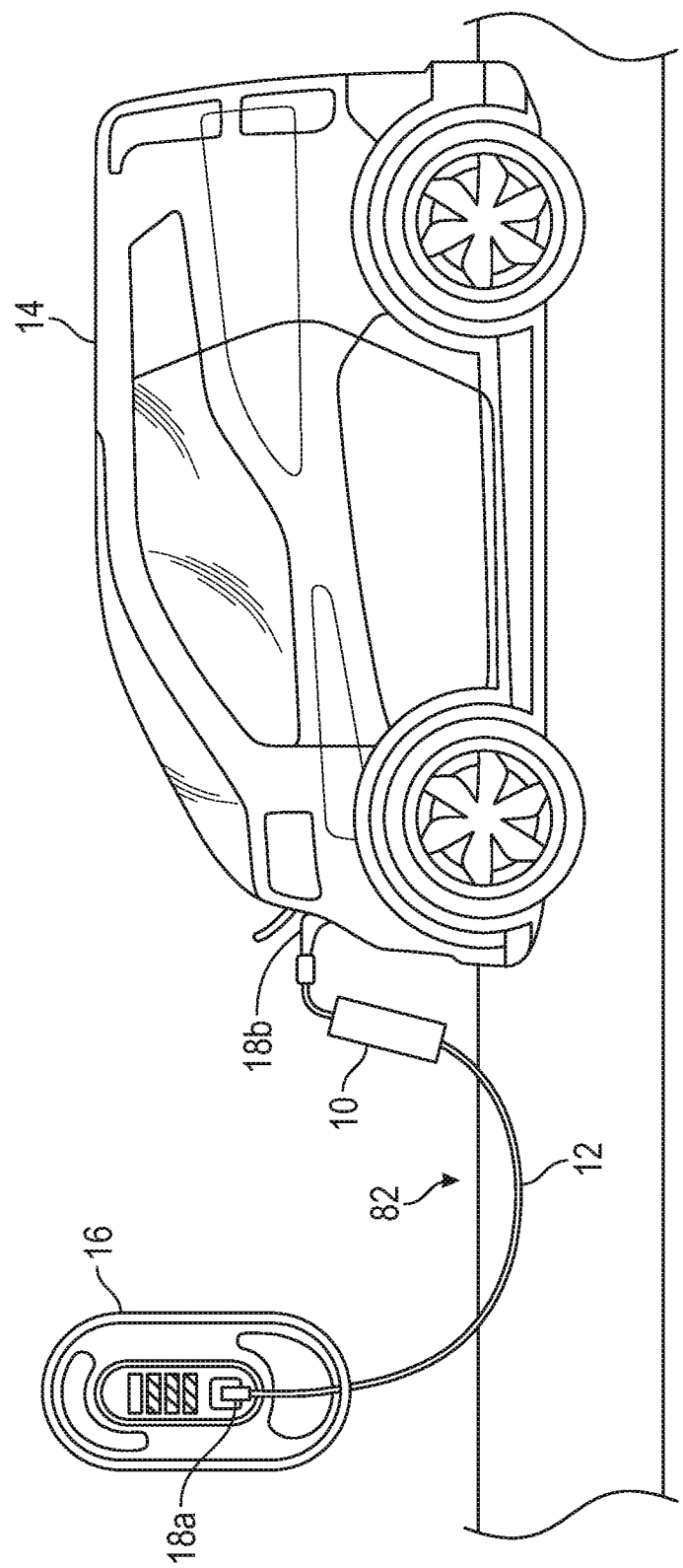
FIG. 1 is a front elevation view of an electric vehicle (EV) shown connected to a charging station by an electric charging cable which has a heat sink device thereon for cooling the electric cable in a manner in accordance with the present disclosure.

The present disclosure is directed to a heat sink apparatus and method for passively removing heat from (i.e., cooling) a high power electric cable, such as an electric charging cable. The apparatus of the present disclosure provides a passive thermal management solution for cooling high power electrical cables and related connectors with a wide range of applications from portable or stationary high power electrical equipment to electric vehicles. For example, by cooling the electric cable of a charging cable utilized to charge a battery pack of an electric vehicle, the apparatus may permit an increase in electrical current through the electric cable thereby reducing charging time for electrical equipment and electric vehicles with minimal maintenance and power equipment. The heat sink device provides a cooling effect regardless of the ambient air conditions. As compared to conventional systems, the presently disclosed apparatus and method for weight reduction of high power cables by using smaller diameter conductors, and enables the handling of greater heat loads, and enables the storage of thermal energy for beneficial use, such as for heating the cabin space in an electric vehicle.

Before further describing various embodiments of the present disclosure in more detail by way of exemplary description, examples, and results, it is to be understood that the embodiments of the present disclosure are not limited in structure and application to the details as set forth in the following description. The embodiments of the present disclosure are capable of being practiced or carried out in various ways not explicitly described herein. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description. While the present disclosure has been described in terms of particular embodiments, it will be apparent to those of skill in the art that variations may be applied to the apparatus and/or methods and in the steps or in the sequence of steps of the methods described herein without departing from the concept, spirit, and scope of the inventive concepts as described herein. All such similar substitutes and modifications apparent to those having ordinary skill in the art are deemed to be within the spirit and scope of the inventive concepts as disclosed herein.

All patents, published patent applications, and non-patent publications referenced or mentioned in any portion of the present specification are indicative of the level of skill of those skilled in the art to which the present disclosure pertains, and are hereby expressly incorporated by reference in their entirety to the same extent as if the contents of each individual patent or publication was specifically and individually incorporated herein. In particular, U.S. Provisional Ser. No. 62/793,047, filed Jan. 16, 2019, is expressly incorporated herein by reference, in its entirety.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

As utilized in accordance with the apparatus, methods and compositions of the present disclosure, the following terms, unless otherwise indicated, shall be understood to have the following meanings:

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the terms "at least one" or "plurality" will be understood to include one as well as any quantity more than one, including but not limited to, 2, 3, 4, 5, 6, 7, 8, 9, 10, 15, 20, 30, 40, 50, 100, or any integer inclusive therein, and/or any range described herein. The terms "at least one" or "plurality" may extend up to 100 or 1000 or more, depending on the term to which it is attached; in addition, the quantities of 100/1000 are not to be considered limiting, as higher limits may also produce satisfactory results. In addition, the use of the term "at least one of x, y and z" will be understood to include x alone, y alone, and z alone, as well as any combination of x, y and z.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "a, b, c, or combinations thereof" is intended to include at least one of: a, b, c, ab, ac, bc, or abc, and if order is important in a particular context, also ba, ca, cb, cba, bca, acb, bac, or cab. Continuing with this example, expressly included are combinations that contain repeats of one or more item or term, such as bb, aaa, aab, bbc, aaabccc, cbbaaa, cababb, and so forth. The skilled artisan will understand that typically there is no limit on the number of items or terms in any combination, unless otherwise apparent from the context.

Throughout this application, the terms "about" and "approximately" are used to indicate that a value includes the inherent variation of error for the composition, the method used to administer the composition, or the variation that exists among the objects, or study subjects. As used herein the qualifiers "about" or "approximately" are intended to include not only the exact value, amount, degree, orientation, or other qualified characteristic or value, but are intended to include some slight variations due to measuring error, manufacturing tolerances, stress exerted on various parts or components, observer error, wear and tear, and combinations thereof, for example. The terms "about" or "approximately", where used herein when referring to a measurable value such as an amount, a temporal duration, thickness, width, length, and the like, is meant to encompass, for example, variations of ±20% or ±10%, or ±5%, or ±1%, or ±0.1% from the specified value, as such variations are appropriate to perform the disclosed methods and as understood by persons having ordinary skill in the art. As used herein, the term "substantially" means that the subsequently described event or circumstance completely occurs or that the subsequently described event or circumstance occurs to a great extent or degree. For example, the term "substantially" means that the subsequently described event or circumstance occurs at least 75% of the time, at least 80% of the time, at least 90% of the time, at least 95% of the time, or at least 98% of the time.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, all numerical values or ranges include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-30 therefore includes 1, 2, 3, 4, 5, 6, 7, 8, 9, 10, 11, 12, 13, 14, 15, 16, 17, 18, 19, 20, 21, 22, 23, 24, 25, 26, 27, 28, 29, and 30, as well as sub-ranges within the greater range, e.g., for 1-30, sub-ranges include but are not limited to 1-10, 2-15, 2-25, 3-30, 10-20, and 20-30. Reference to a range of 1-50 therefore includes 1, 2, 3, 4, 5, 6, 7, 8, 9, 10, 11, 12, 13, 14, 15, 16, 17, 18, 19, 20, 21, 22, 23, 24, 25, 26, 27, 28, 29, and 30, etc., up to and including 50. Reference to a series of ranges includes ranges which combine the values of the boundaries of different ranges within the series. Thus, to illustrate reference to a series of ranges, for example, a range of 1-1,000 includes, but is not limited to, 1-10, 2-15, 2-25, 3-30, 10-20, 20-30, 30-40, 40-50, 50-60, 60-75, 75-100, 100-150, 150-200, 200-250, 250-300, 300-400, 400-500, 500-750, 750-1,000, and includes ranges of 1-20, 10-50, 50-100, 100-500, and 500-1,000. The range 1 mm to 10 m therefore refers to and includes all values or ranges of values, and fractions of the values and integers within said range, including for example, but not limited to, 5 mm to 9 m, 10 mm to 5 m, 10 mm to 7.5 m, 7.5 mm to 8 m, 20 mm to 6 m, 15 mm to 1 m, 31 mm to 800 cm, 50 mm to 500 mm, 4 mm to 2.8 m, and 10 cm to 150 cm. Any two values within the range of 1 mm to 10 m therefore can be used to set a lower and an upper boundaries of a range in accordance with the embodiments of the present disclosure.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

The inventive concepts of the present disclosure will be more readily understood by reference to the following examples and embodiments, which are included merely for purposes of illustration of certain aspects and embodiments thereof, and are not intended to be limitations of the disclosure in any way whatsoever. Those skilled in the art will promptly recognize appropriate variations of the apparatus, compositions, components, procedures and method shown below.

Referring now to FIG. 1, shown therein is a heat sink device 10 constructed in accordance with the present disclosure. In at least one embodiment, the heat sink device 10 is configured to surround and engage with at least a portion of an electric cable 12 used to provide an electric current for charging a battery pack (not shown) of an electric vehicle (EV) 14. The electric cable 12 has a current input end 18a for connecting to a charging station 16 and a current output end 18b for connecting to an electric socket of the EV 14 as described in further detail below. In use, the heat sink device 10 engages an outer surface of the electric cable 12 so as to be thermally coupled with the electric cable 12 such that heat generated by the electric cable 12 is absorbed by the heat sink device 10. In the installed position, the heat sink device 10 engages and surrounds the external portion of the electric cable 12. The electric cable 12 may be any charging cable known in the art suitable for charging the battery pack of the EV 14 or other piece of electrical equipment which is desired to be charged or powered using the electric cable 12.

The electric cable 12 may include at least two electrical conductors that are electrically isolated by a dielectric material. The electrical conductors of the electric cable 12 may be constructed of an electrically conductive material, such as gold, silver, copper, aluminum or graphite or any other suitable material known to those of ordinary skill in the art for constructing electric cables for transmission of electrical current. The dielectric material of the electric cable 12 may be in the form of a polymer cover or any other suitable material. The requirements for construction of electric cables for charging battery packs are well known to those of ordinary skill in the art. Thus, no further comment regarding the construction of the electric cable 12 is deemed necessary herein. The heat sink device 10 may be used with a residential charging station or a commercial charging station or any other similar charging station known in the art.

Figure 2:
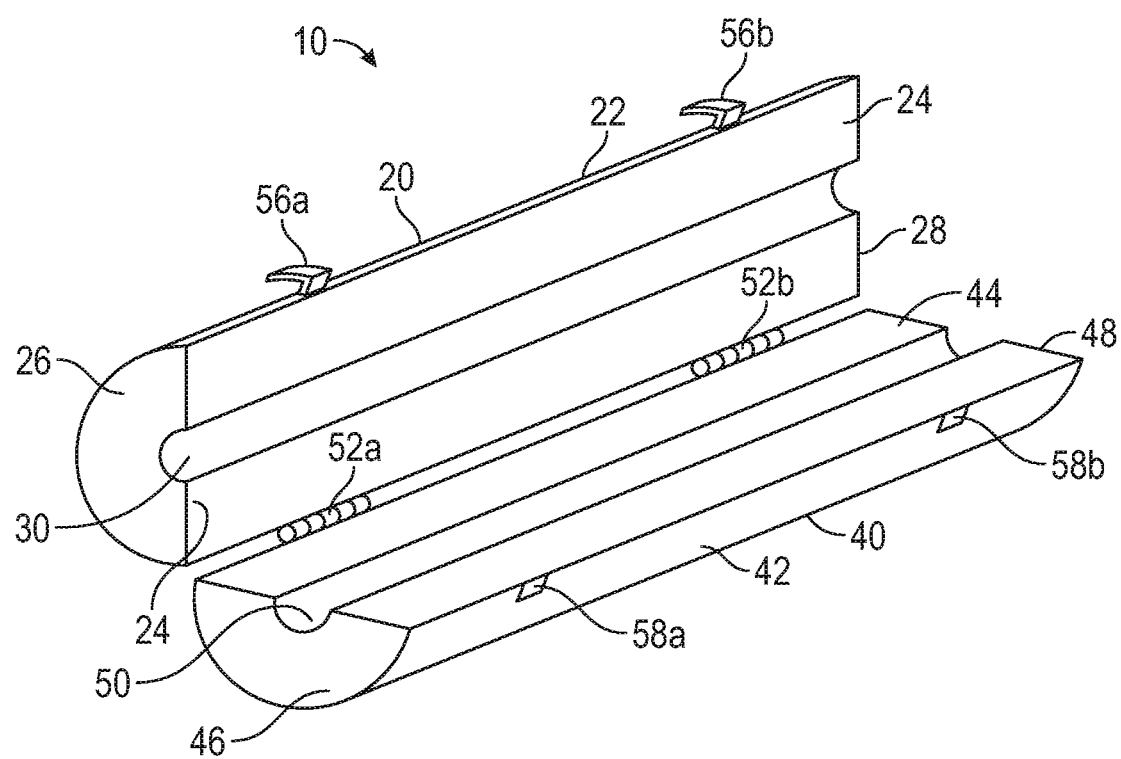
FIG. 2 is a perspective view of an exemplary embodiment of the heat sink device of FIG. 1, shown in an open position.
Figure 3:
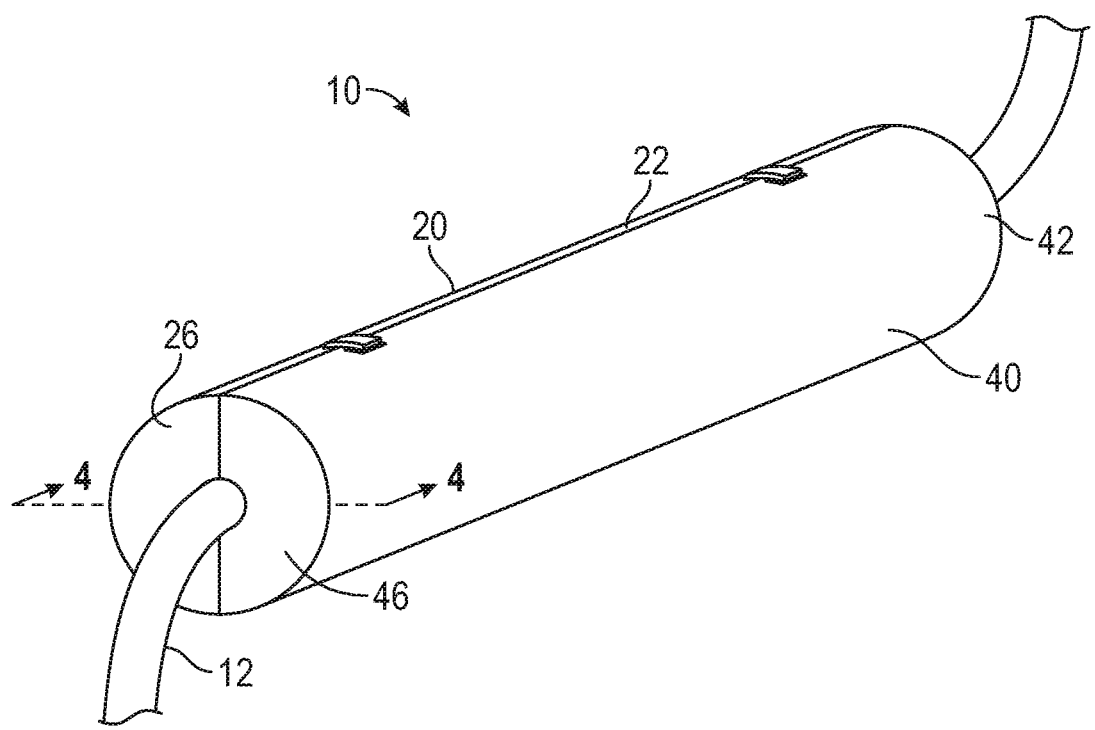
FIG. 3 is a perspective view of the heart sink device of FIG. 2, shown in a closed position and enclosing a portion of the electric cable.

A non-limiting embodiment of the heat sink device 10 is shown in perspective in FIG. 2 in an open configuration. The heat sink device 10 has a first casing 20 and a second casing 40 arranged in a hinged "clamshell" arrangement. In the example shown, the first casing 20 and the second casing 40 are both of semi-cylindrical shape. By way of example, the first casing 20 will be described hereinafter as a first semi-cylindrical casing 20, and the second casing 40 will be described hereinafter as a second semi-cylindrical casing 40. It should be understood, however, that the first casing 20 and the second casing 40 can be shaped in other ways, so as to form together a geometric shape, animal shape, or a fanciful shape. The first semi-cylindrical casing 20 has an outer wall 22, an inner wall 24, a first end wall 26, a second end wall 28, and a first semi-cylindrical cable receiving space 30. The second semi-cylindrical casing 40 has an outer wall 42, an inner wall 44, a first end wall 46, a second end wall 48, and a second semi-cylindrical cable receiving space 50. The first semi-cylindrical casing 20 is connected to the second semi-cylindrical casing 40 via a hinge mechanism, such as a pair of hinges 52a and 52b, or via a single hinge. The hinge mechanism enables the first semi-cylindrical casing 20 and the second semi-cylindrical casing 40 to be pivotably closed such that the inner wall 24 faces and engages the inner wall 44, causing the first semi-cylindrical cable receiving space 30 to oppose the second semi-cylindrical cable receiving space 50, forming a tubular bore 54 which extends longitudinally through the center of the closed heat sink device 10 for containing and surrounding a portion of the electric cable 12 (see FIGS. 3 and 4). The heat sink device 10 further comprises a fastening or clamping mechanism such as a first fastener 56a and a second fastener 56b attached to the outer wall 22, and a corresponding first clasp 58a, and second clasp 58b attached to the outer wall 42 which function together to secure the heat sink device 10 in the closed position, as shown in FIG. 3. In an alternative embodiment the first semi-cylindrical casing 20 is connectable to the second semi-cylindrical casing 40 via any other securing mechanism such as, but not limited to, belts, cords, straps, loops, permanent magnets or the like.

The inner wall 24 of the first semi-cylindrical casing 20 and the inner wall 44 of the second semi-cylindrical casing 40 may both be constructed of a high thermal conductivity material (as discussed elsewhere herein) to enable heat to pass readily from the electric cable 12 into the phase change material 62. It may also be desirable in certain cases for the outer walls 22 and 42 to be constructed of the same type or a different type of high thermal conductivity material as used to construct the inner walls. Alternatively, it may be desirable to construct the outer walls 22 and 42, or portions thereof, with a low thermal conductivity material to reduce the outer wall temperatures to reduce the heating of the outer walls so the heat sink device does not become excessively hot to the touch.

Figure 4:
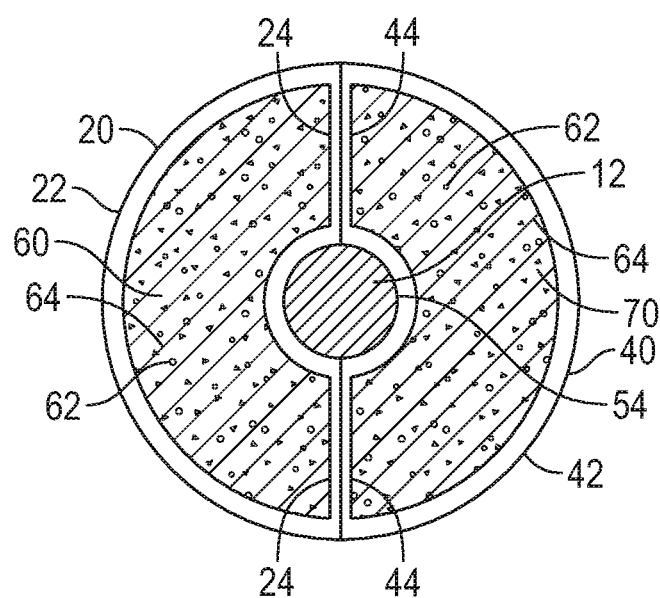
FIG. 4 is a cross-sectional view of the closed heat sink device shown in FIG. 3, taken along line 4-4.

As shown in FIG. 4, a cross-section taken through the closed heat sink device 10 of FIG. 3, the first semi-cylindrical casing 20 has an inner space 60 between the outer wall 22 and the inner wall 24. The inner space 60 contains a phase change material 62 (generally a solid or semi-solid material at room temperature). The inner space 60 may further contain a support material 64 made of a material such as a high thermal conductivity metal foam or graphite foam, or mesh or an array of metal foils or other thermally conductive high porosity material such as sponge or expanded graphite, which contains and supports the phase change material 62. At least one role of the support material 64 is to increase the heat transfer rates in and out of the phase change material 62 by improving its effective thermal conductivity. Similarly, the second semi-cylindrical casing 40 has an inner space 70 between the outer wall 42 and the inner wall 44 which contains a quantity of the phase change material 62 and which may also contain the support material 64 for supporting the phase change material 62. The phase change material 62 in the casings 20 and 40 functions to absorb and store the heat generated as current flows through the electric cable 12 as the EV 14 is charged, thereby reducing the temperature of the electric cable 12 and allowing for increased current to be supplied through the electrical conductors of the electric cable 12 without overheating. Increasing the current through the electrical conductors of the electric cable 12 results in decreased charging time of the battery pack within the EV 14 without overheating the electric cable. Alternatively, the controlled temperature may be exploited to decrease the mass and weight of conductor by running greater currents through smaller diameter cables. As the phase change material 62 absorbs heat, it may transition from an original solid state to a semi-solid state or to a liquid state, or from an original semi-solid state to a liquid state. The phase change material 62, by absorbing heat from the electric cable 12, functions to passively cool the electric cable 12 during the charging session. The amount and type of the phase change material 62 may be selected to absorb and store more or less than the maximum amount of heat generated by the electric cable 12 during a single charging session of the battery pack within the EV 14, thereby being effective to reduce the temperature of the electric cable throughout the charging session.

During periods in which the electric cable 12 is not being used to charge the battery pack, the heat sink device 10 can remain installed on the electric cable 12 and will dissipate the absorbed heat to the surrounding environment thereby transitioning from the liquid state back to the semi-solid state or the solid state, or from the semi-solid state the solid state. The heat sink device 10 may be suited for residential use to allow for intermittent cooling of the phase change material 62 in-between charging sessions. The outer walls 22 and 42 and inner walls 24 and 44 may be constructed of a thermally conductive material. Suitable thermally conductive material can be but is not limited to, polymers, ceramics, and metals such as gold, silver, copper, or aluminum or metal alloys.

The heat sink device 10 may have, in non-limiting embodiments, a diameter in a range of 1 cm to 10 cm, and a length in a range of 5 cm to 100 cm.

In certain embodiments, the phase change material 62 is in a solid state before the charging session and remains in a solid state after being heated during the charging session. In certain embodiments, the phase change material 62 is in a semi-solid state before the charging session and remains in a semi-solid state after being heated during the charging session. In certain embodiments, the phase change material 62 is in a liquid state before the charging session and remains in a liquid state after being heated during the charging session. In certain embodiments wherein the phase change material 62 is in a solid state before the charging session and remains in a solid state after being heated during the charging session, the heat sink device 10 may be constructed without the inner walls 24 and 44 and/or the outer walls 22 and 42. The solid phase change material 62 may have a crystalline lattice configuration.

The phase change material 62 is in thermal communication with the inner walls 24 and 44, respectively, to absorb and store heat being generated by the electric cable 12. When the EV 14 is charged and an electric current passes through the electric cable 12, an amount of heat is transferred from the electric cable 12 via the inner walls 24 and 44 to the phase change material 62, causing the phase change material 62, in certain embodiments, to change from a solid state to a semi-solid state or to a liquid state. For example, the phase change material 62 may initially be solid at room temperature. During the charging session, as electrical current passes through the electric cable 12, heat is generated and is absorbed by the phase change material 62. When the temperature of the phase change material 62 rises above its melting point, a phase change is triggered and the majority of the heat from the electric cable 12 may be absorbed as the heat of fusion of the phase change material 62 remains at a virtually constant temperature. The fairly constant cooling temperature holds until the entire mass of the phase change material 62 is melted. After the EV 14 is fully charged (and the phase change material 62 is completely or partially melted), the heat sink device 10 may remain attached to the electric cable 12, or may be detached from the electric cable 12. In either case, the heat sink device 10 is left in an ambient condition or a cooling medium to allow the phase change material 62 to cool and re-solidify.

The phase change material 62 of the present disclosure may be comprised of a variety of materials including, organic materials, such as paraffin wax; inorganic materials, such as salt hydrates; inorganic eutectics, such as c-inorganic, inorganic-inorganic compounds; hygroscopic materials; and solid-solid phase change materials. Solid to solid phase change materials undergo a solid/solid phase change transition with the associated absorption and release of heat. The solid/solid phase change materials may change crystalline structure from one lattice configuration to another lattice configuration at a fixed and defined temperature. In the case of paraffin wax, the paraffin wax may have a melting point within a range from about 115° F. to 154° F. Non-limiting examples include paraffin waxes with the compositions $C_{36}H_{74}$, $C_{32}H_{66}$, and $C_{30}H_{62}$. Other examples of the phase change material 62 that may be used herein include, but are not limited to, non-paraffin organics, and hydrated salts.

Figure 5:
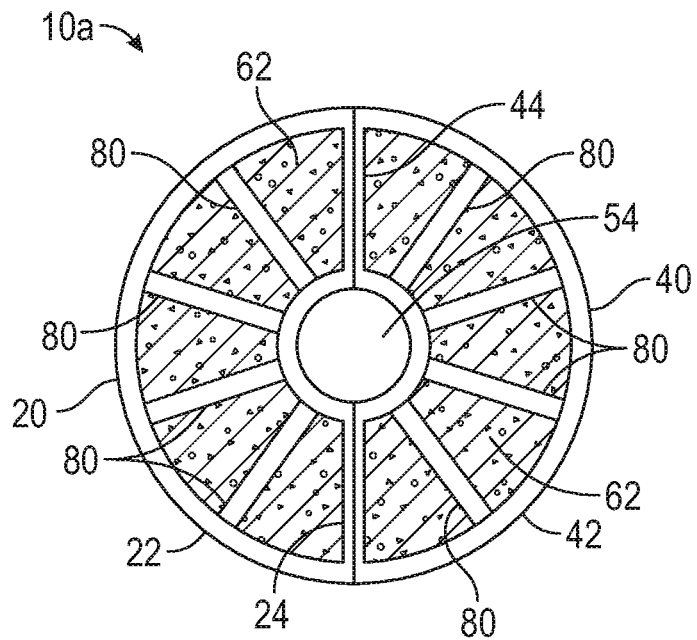
FIG. 5 is a cross-sectional view of another embodiment of a heat sink device constructed in accordance with the present disclosure.

FIG. 5 shows another embodiment of a heat sink device designated by the general reference numeral 10a constructed in a manner similar to the heat sink device 10 but further comprising a plurality of heat pipes 80 extending perpendicularly from the inner walls 24 and 44 to the outer walls 22 and 42, respectively, and embedded within the phase change material 62 and support material 64, when present. The heat pipes 80 facilitate the distribution of the heat from the electric cable 12 throughout the phase change material 62. The heat pipes 80 may also serve to help support the porous material in those embodiments containing a porous material, for example a foil array. The plurality of heat pipes 80 may be any suitable heat pipe known in the art including, but not limited to, steel-toluene heat pipes. The plurality of heat pipes 80 improve the thermal performance of the heat sink device 10a relative to the heat sink device 10 by more effectively conveying heat away from the electric cable 12. The plurality of heat pipes 80 provide passive heat transfer with a high effective thermal conductivity, in which heat is transferred by evaporation and condensation of a working fluid in a sealed container, the heat pipe. By way of example only, a heat pipe, such as one of the heat pipes 80, may comprise a sealed pipe or tube made of a material that is compatible with the working fluid such as copper for water heat pipes, or aluminum for ammonia heat pipes. Typically, a vacuum pump is first used to remove the air from the empty heat pipe. The heat pipe is partially filled with a working fluid and then sealed. The working fluid mass is chosen so that the heat pipe contains both vapor and liquid over the operating temperature range. As one having ordinary skill in the art should appreciate, for a heat pipe to transfer heat, it should contain saturated liquid and its vapor (gas phase). The saturated liquid vaporizes and travels to a condenser, where it is cooled and turned back to a saturated liquid. In known heat pipes, the condensed liquid is returned to the evaporator using a wick structure exerting a capillary action on the liquid phase of the working fluid. Wick structures used in heat pipes may include sintered metal powder, screen, and grooved wicks, which have a series of grooves parallel to the pipe axis. When the condenser is located above the evaporator in a gravitational field, gravity can return the liquid. The above description of a heat pipe is provided for exemplary purposes only and should in no way be construed to limit the inventive concepts disclosed herein.

Figure 6:
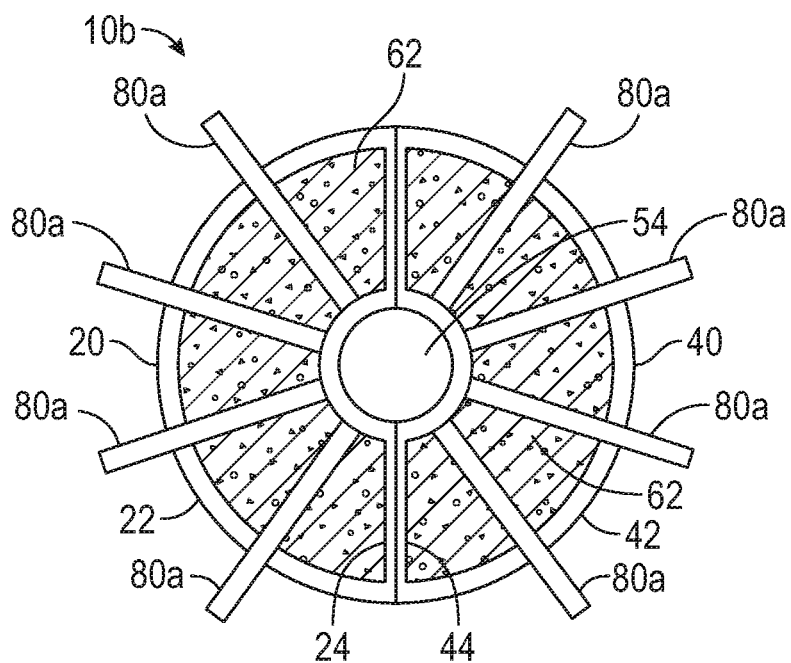
FIG. 6 is a cross-sectional view of another embodiment of a heat sink device constructed in accordance with the present disclosure.

An alternative embodiment of a heat sink device is designated by the general reference numeral 10b and is shown in FIG. 6. Heat sink device 10b is similar to heat sink device 10a, in that it contains a plurality of heat pipes 80a. However, the plurality of heat pipes 80a extend at least partially through the outer walls 22 and 42 of the first semi-cylindrical casing 20 and the second semi-cylindrical casing 40, respectively, thereby further enhancing the conveyance of the heat through the outer walls 22 and 42.

The heat sink devices 10, 10a, and 10b or any other heat sink device described herein may be used with existing or newly designed electric cables, or may be supplied with an electric cable, such as electric cable 12, which together form an electric cable assembly 82 (FIG. 1). In some embodiments, the heat sink device 10, 10a, and 10b of the present disclosure is co-extensive with the electric cable 12 so as to surround substantially the entire length of the electric cable 12, as described elsewhere herein. In certain alternate embodiments, the heat sink devices 10, 10a, and 10b may be constructed so as to be semi-permanently attachable or permanently (i.e., non-removably) attachable about the electric cable 12. In such cases, the heat sink devices 10, 10a, and 10b may be constructed without a hinge mechanism and the first semi-cylindrical casing 20 and second semi-cylindrical casing 40 may be placed about the electric cable 12 as shown above, and the two casings affixed together by fastening mechanisms such as clamps or screws or other similarly removable devices, or they may be affixed together by a weld to form the permanent fixation.

Figure 7:
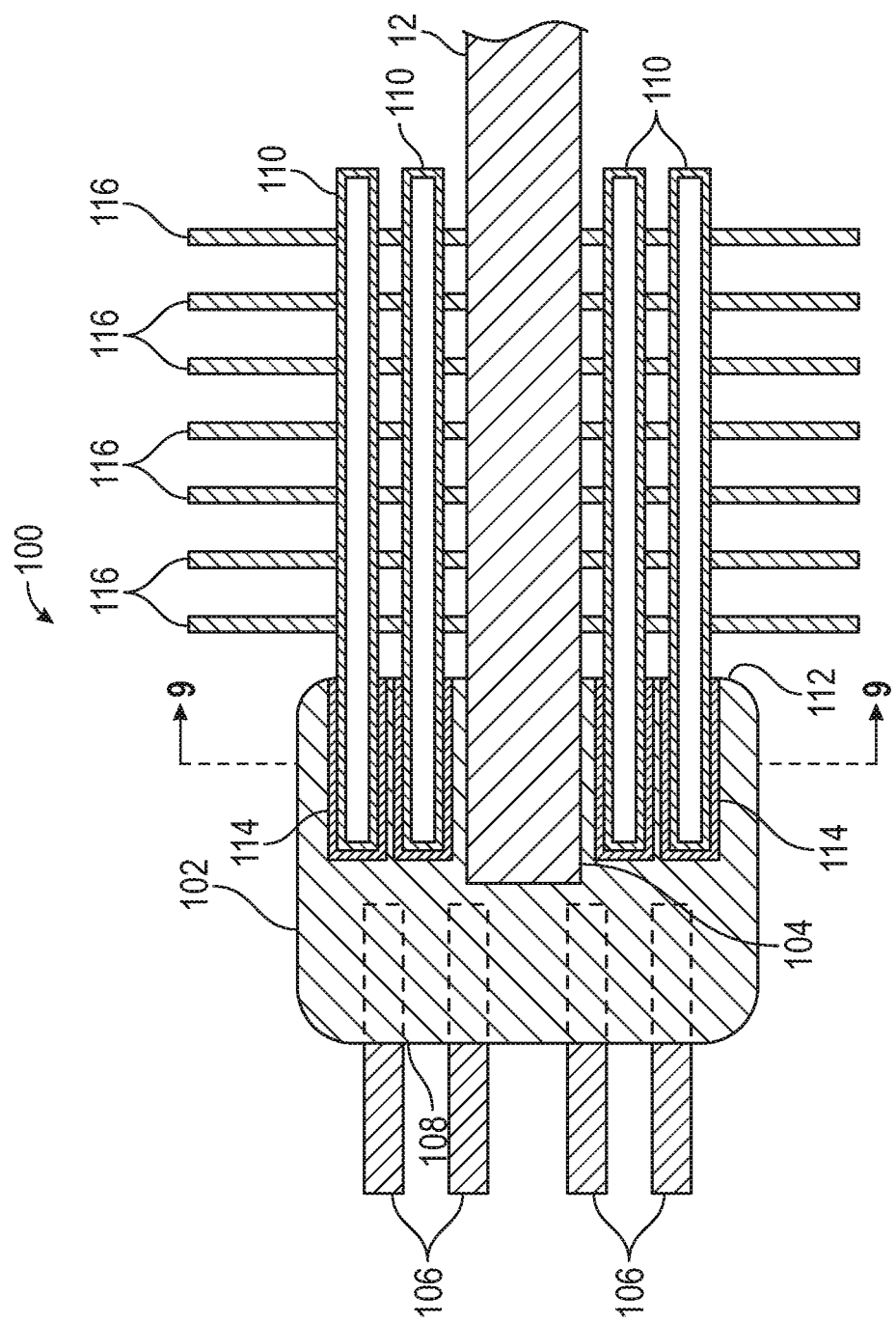
FIG. 7 is a diagrammatic cross-sectional view of a current transfer connector of an electric cable assembly constructed in accordance with the present disclosure.
Figure 9:
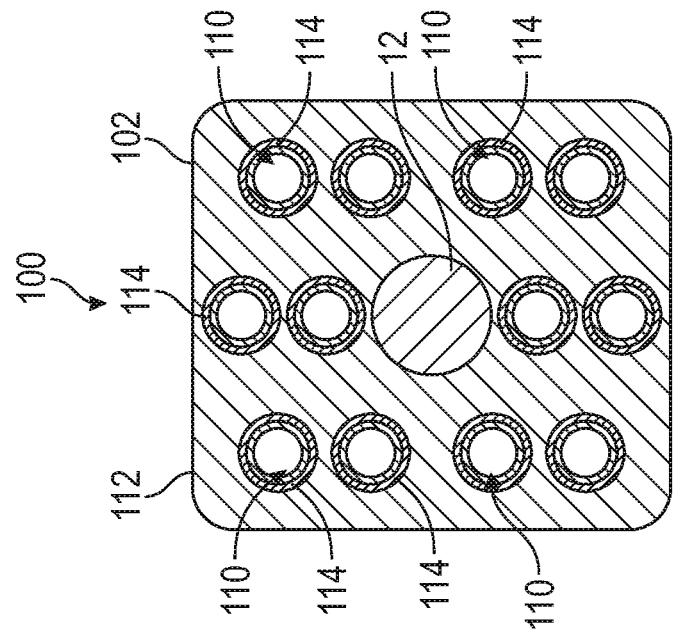
FIG. 9 is an end view of the current transfer connector of FIG. 7.
Figure 8:
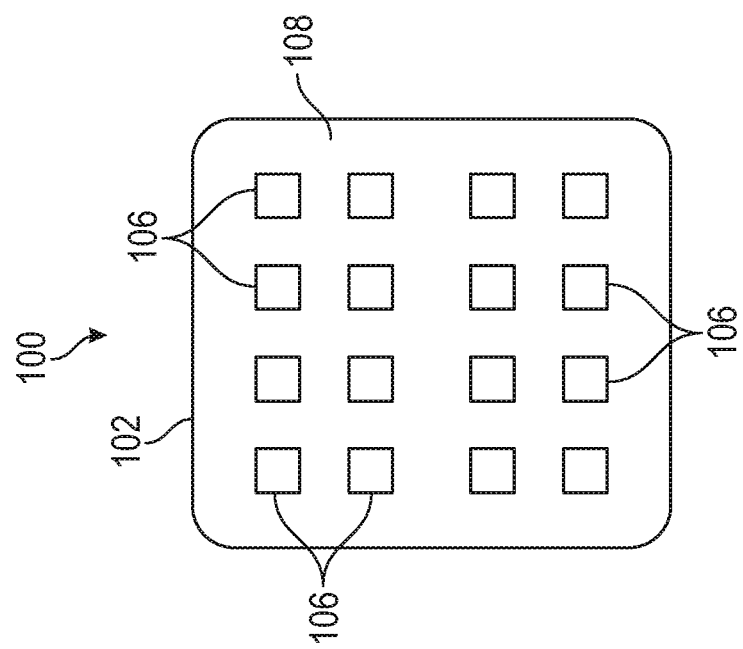
FIG. 8 is a cross-sectional view taken along line 8-8 of FIG. 7.

The electric cable 12 may be connectable to the electric vehicle 14 (or battery pack) and to the charging station 16 by any suitable connecting device. A non-limiting embodiment of such a connector for connecting the electric cable 12 to the electric vehicle 14 (or battery pack) and/or the charging station 16 is shown in FIGS. 7-9 and is designated therein by the general reference numeral 100. The connector 100 is constructed with a connector block 102 into which an end portion 104 of the electric cable 12 is fixed. The end portion 104 of the electric cable 12 may extend into the connector block 102 a distance that is, for example, about half the length of the connector block 102. One or more prongs 106 are inserted into and extend from a first end 108 of the connector block 102. The one or more prongs 106 (also known as blades or pins) may be made of a high thermal conductivity material such as copper or aluminum to minimize the electrical resistance while providing mechanical strength. The prong 106 may be comprised of one unitary piece to minimize the contact resistances. The one or more prongs 106 are configured to mate with a corresponding electrical socket on the EV 14. The connector block 102 and the one or more prongs 106 may be formed of a solid material with high electrical conductivity including, but not limited to copper, aluminum, metal alloy, polymer, or graphite. The shape of the connector block 102 may be selected from a variety of shapes and may have, in non-limiting embodiments, a length in a range of 10 mm to 200 mm, and may have, but is not limited to having, a width in a range between 10 mm to 200 mm. The connector 100 may conform to requirements of at least one of a Society of Automotive Engineers J1772 connector specification, such as the J1772-2001 specification, or the J1772-2009 specification.

The connector 100 of the non-limiting embodiment of FIGS. 7-9 further includes a plurality of heat pipes 100 for passive heat transfer which are inserted into and fixedly embedded in the connector block 102 and extend from a second end 112 of the connector block 102. The plurality of heat pipes 110 facilitate a transfer of an amount of heat from the connector block 102 to the ambient air when an electrical current passes from an electric load (such as from the charging station 16 or into the EV 14). Each heat pipe 110 may optionally be electrically insulated from the connector block 102 by an insulating sleeve 114, which may be comprised of a high thermal conductivity ceramic, polymer, or plastic material. The heat pipes 110 may provide a cooling effect for the connector block 102 by evaporation and recondensation of an internal working fluid within the heat pipes and dissipates the heat to the ambient air by natural convection. As one having ordinary skill in the art will appreciate, heat pipes include shells that are generally made from high thermal conductivity material such as copper or aluminum or other material. The exposed portions of the heat pipes 110 may be connected to a plurality of fins 116 (constructed for example of a heat conductive metal increase natural convection from the heat pipes 110 to the ambient air. The heat pipes 110 may be any constructed of any suitable heat pipe known in the art as described above with reference to the heat pipes 80 and 80a.

While the present disclosure has been described herein in connection with certain embodiments so that aspects thereof may be more fully understood and appreciated, it is not intended that the present disclosure be limited to these particular embodiments. On the contrary, it is intended that all alternatives, modifications and equivalents are included within the scope of the present disclosure as defined herein. Thus the examples described above, which include particular embodiments, will serve to illustrate the practice of the inventive concepts of the present disclosure, it being understood that the particulars shown are by way of example and for purposes of illustrative discussion of particular embodiments only and are presented in the cause of providing what is believed to be the most useful and readily understood description of procedures as well as of the principles and conceptual aspects of the present disclosure. Changes may be made in the devices, components and methods described herein, and in the steps or the sequence of steps of the methods described herein without departing from the spirit and scope of the present disclosure. Further, while various embodiments of the present disclosure have been described in claims herein below, it is not intended that the present disclosure be limited to these particular claims. Applicants reserve the right to amend, add to, or replace the claims indicated herein below in subsequent patent applications.

What is claimed is:

1. A heat sink apparatus configured to be removably attached to an electric vehicle charging cable, the heat sink apparatus comprising:
    a first casing having an outer wall, an inner wall, a first end wall, a second end wall, and an inner space, the inner wall comprising a first cable receiving space;
    a second casing having an outer wall, an inner wall, a first end wall, a second end wall, and an inner space, the inner wall comprising a second cable receiving space;
    a hinge mechanism connected to the first casing and to the second casing enabling the first casing and the second casing to be selectively placed in one of an open position and a closed position in a clamshell arrangement such that, in the closed position, a facing portion of the inner wall of the first casing faces and engages a facing portion of the inner wall of the second casing and causes the first cable receiving space to oppose the second cable receiving space thereby forming a lengthwise tubular bore containing the electric vehicle charging cable when the heat sink apparatus is attached to the electric vehicle charging cable such that the electric vehicle charging cable engages the facing portion of the inner wall of the first casing and the facing portion of the inner wall of the second casing; and
    a phase change material contained within the inner space of the first casing and the inner space of the second casing, the phase change material changeable between a first state and a second state when heat generated by the electric vehicle charging cable exceeds a predetermined temperature; and
    wherein the inner wall of the first casing and the inner wall of the second casing are constructed of a first material with a high thermal conductivity, and the outer wall of the first casing and the outer wall of the second casing are constructed of a second material with a low thermal conductivity.

2. The heat sink apparatus of claim 1, further comprising a fastening mechanism having a first portion connected to the first casing and a second portion connected to the second casing such that, when the first casing and the second casing are placed in the closed position, the first portion is operable to engage the second portion to maintain the first casing and the second casing in the closed position about the electric cable.

3. The heat sink apparatus of claim 1, further comprising a support material which contains the phase change material contained within the inner space of the first casing and within the inner space of the second casing.

4. The heat sink apparatus of claim 1, further comprising a plurality of heat pipes embedded in the phase change material, wherein the plurality of heat pipes embedded in the phase change material extend outwardly from the outer wall of the first casing and from the outer wall of the second casing.

5. The heat sink apparatus of claim 1, further comprising a securing mechanism connected to the first casing and the second casing such that, when the first casing and the second casing are placed in the closed position, the securing mechanism may connect the first casing and the second casing to maintain the first casing and the second casing in the closed position about the electric cable.

* * * * *